United States Patent [19]
Apel

[11] Patent Number: 5,208,726
[45] Date of Patent: May 4, 1993

[54] METAL-INSULATOR-METAL (MIM) CAPACITOR-AROUND-VIA STRUCTURE FOR A MONOLITHIC MICROWAVE INTEGRATED CIRCUIT (MMIC) AND METHOD OF MANUFACTURING SAME

[75] Inventor: Thomas R. Apel, Sunnyvale, Calif.

[73] Assignee: Teledyne Monolithic Microwave, Mountain View, Calif.

[21] Appl. No.: 860,641

[22] Filed: Apr. 3, 1992

[51] Int. Cl.$^5$ .................... H01L 39/02; H01G 4/06; H05K 5/00

[52] U.S. Cl. .................... 257/532; 257/276; 257/277; 437/203

[58] Field of Search .................. 357/51; 361/311-313, 361/321; 174/52.4

[56] References Cited

U.S. PATENT DOCUMENTS 4,959,705 9/1990 Lemnios et al. .................... 357/51
5,055,966 10/1991 Smith et al. .................... 361/321

Primary Examiner—Donald A. Griffin
Attorney, Agent, or Firm—Townsend and Townsend

[57] ABSTRACT

A metal-insulator-metal (MIM) capacitor for monolithic microwave integrated circuit applications of the capacitoraround-via type having a bottom plate 36, a dielectric 40, and a top plate 44 which substantially surround, but do not physically overlay, via hole 32 and provide a low-inductance connection between a frontside MIM capacitor and a backside ground plane.

4 Claims, 4 Drawing Sheets

METAL-INSULATOR-METAL (MIM) CAPACITOR-AROUND-VIA STRUCTURE FOR A MONOLITHIC MICROWAVE INTEGRATED CIRCUIT (MMIC) AND METHOD OF MANUFACTURING SAME

The U.S. Government has a paid-up license in this invention and the right in limited circumstances to require the patent owner to license others on reasonable terms as provided for by the terms of the MIMIC Phase I Program, NAVAIR Contract N00019-88-C-0218, awarded by the Department of Defense.

BACKGROUND OF THE INVENTION

1. Field of the Invention

The present invention relates generally to metal-insulator-metal (MIM) capacitors for monolithic microwave integrated circuit (MMIC) applications and, more particularly, relates to a capacitor-around-via structure for MMICs.

2. Brief Description of the Relevant Art

The trend in microwave-frequency electronic systems is toward increasing integration, reliability, and lower cost in large-volume production. Typical microwave-frequency applications include satellite communication systems, phasedarray radars, electronic warfare systems, and the like.

Since the early 1980s, the widespread availability of monolithic microwave integrated circuits (MMICs) has spearheaded the drive toward greater integration and reliability. MMIC technology entails a multi-level process approach, characterized by all active and passive circuit elements and their interconnections being formed into the bulk or onto the surface of a semi-insulating substrate (e.g., GaAs). The circuit elements and interconnections are fabricated by utilizing some deposition scheme such as epitaxy, ion implantation, sputtering, evaporation, diffusion, or a combination of these processes.

The passive circuit elements for monolithic microwave circuits include distributed elements (transmission lines), traditional lumped elements (capacitors, inductors, and resistors), and circuit interconnections (via holes and air bridges). Capacitor structures are used, inter alia, for tuning elements, for interstage isolation, for RF bypass, and for matching applications.

Depending upon the application being considered, MMIC designers may choose between (1) interdigitated capacitors for low capacitance values (less than 1 Pf); and (2) parallel plate, metal-insulator-metal (MIM) capacitors for higher capacitance values (1–20 pF). The MIM capacitor is formed by two metallized areas separated by a dielectric material.

One plate of a MIM capacitor often must be grounded, preferably by a low-inductance connection. State-of-the-art MMIC designs typically employ via holes to make a low-inductance ground connection between a backside ground plane and a frontside, first-level metal layer serving as a capacitor plate. Via-hole technology for MMICs involves etching holes through the GaAs substrate and then metallizing the interior of the via hole and the back surface of the wafer to provide a good connection between the overlying frontside metal and the backside ground plane.

A reliable design for MIM capacitors is important because some MMIC circuits contain more capacitors than any other component. Thus, the capacitor yield could dominate the overall yield of the MMIC. Thus, to preserve their considerable investment in the already-completed frontside fabrication, most foundries take a conservative approach to implementing capacitor-via structures, particularly with respect to backside processing of via holes.

Two primary capacitor-via-hole structure have been realized to date. The earliest embodiment of these is the capacitor-near-via structure, characterized by a rectangular MIM capacitor placed adjacent to a via pad. Shown in FIG. 1, this prior art capacitor-near-via configuration presents no fabrication problems and is compatible with most processes. The MIM parallel-plate capacitor is fabricated adjacently to the via hole, and, typically, the via hole pad is electrically common with the first-level metallization (bottom plate) of the MIM. Unfortunately, the capacitor-near-via structure is wasteful of circuit area and is the source of undesirable parasitic path inductances.

A second, later-developed embodiment is the capacitor-over-via structure, characterized by a MIM capacitor placed directly over the via pad. Shown in FIG. 2, this prior art configuration represents a significant improvement over the capacitor-near-via structure because the capacitor-over-via structure requires less space and minimizes the ever-present parasitic path inductance problem. Unfortunately, this structure is difficult to fabricate and is not compatible with processes employed by most MMIC foundries. Accordingly, the capacitor-over-via structure has not been widely adopted.

Thus, there exists a need in the art of MMIC design for a new MIM capacitor structure that has beneficial properties similar to the capacitor-over-via structure, yet is compatible with processes in most available foundries.

SUMMARY OF THE INVENTION

The present invention involves a technique for forming a new capacitor-around-via structure suitable for incorporation on monolithic microwave integrated circuits. More particularly, according to the technique neither the dielectric layer nor the top capacitor plate is formed directly over the via hole. Rather, the dielectric and top plate substantially surround, but do not physically overlay, the via hole.

According to one aspect of the invention, the capacitor-around-via structure provides a low-inductance connection between a frontside MIM capacitor and a backside ground plane.

According to another aspect of the invention, the capacitor-around-via structure requires minimal chip area to implement.

According to yet another aspect of the invention, the capacitor-around-via structure may be fabricated using widely available fabrication processes that do not require either the dielectric layer or the top capacitor plate to reside directly over the via hole.

According to yet another aspect of the invention, a monolithic microwave integrated circuit incorporating capacitor-around-via structures allows a high component packing density to be achieved.

Other advantages and features of the invention will become apparent in view of the drawings and of the following detailed description.

DETAILED DESCRIPTION OF THE PREFERRED EMBODIMENTS

Figure 1:
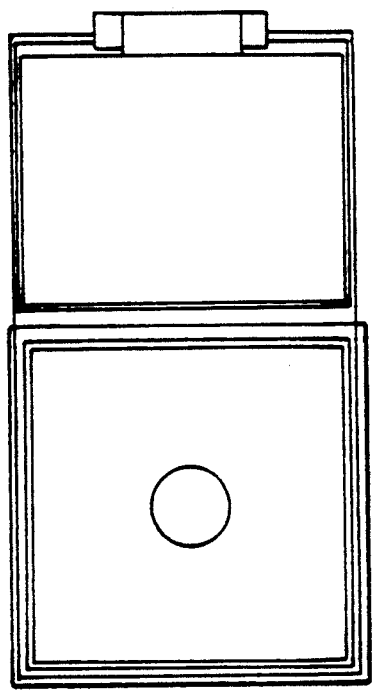
FIG. 1 is a diagram of a prior art capacitor-nearvia structure.
Figure 2:
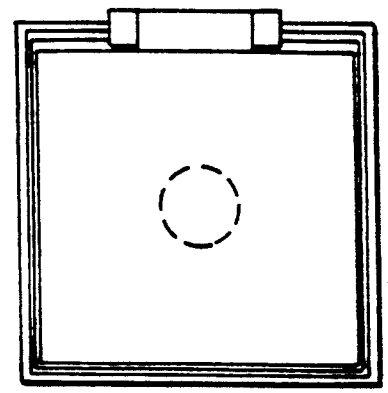
FIG. 2 is a diagram of a prior art capacitor-overvia structure.
Figure 3:
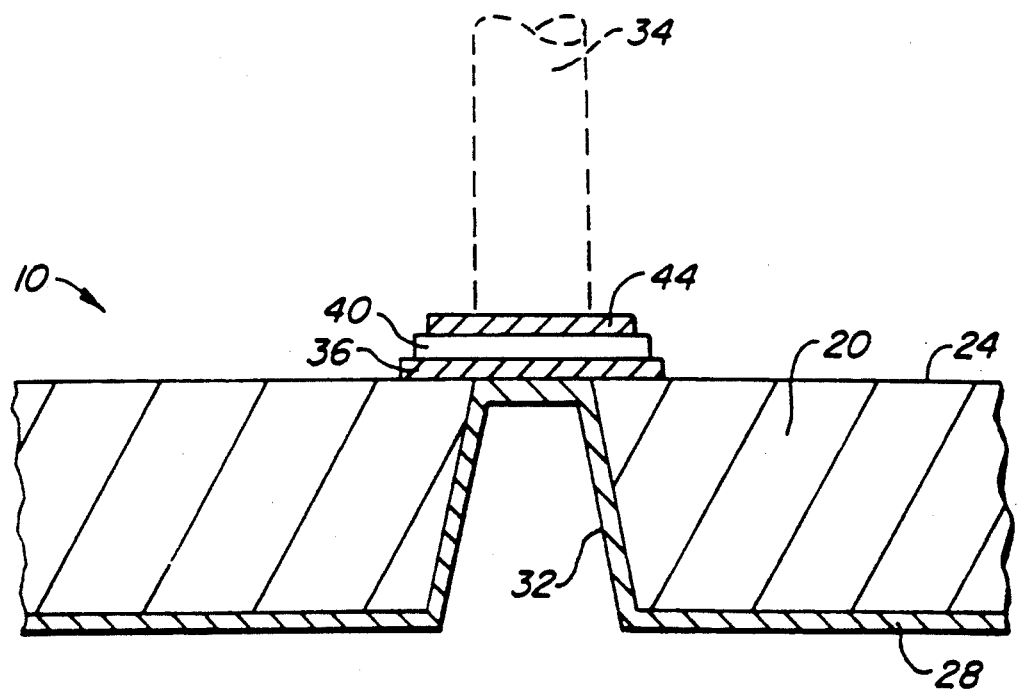
FIG. 3 is a diagram of a cut-away, cross-sectional view of an embodiment of a capacitor-around-via structure formed on a semi-insulating substrate.

FIG. 3 is a diagram of a cut-away, cross-sectional view of a capacitor-around-via structure that resides in and on a monolithic microwave integrated circuit (MMIC) 10. A semi-insulating substrate 20 has a frontside surface 24 and a ground plane 28 by virtue of a backside metallization process. A volume extending from the via hole 32 defines a capacitor exclusion zone 34.

A first conductive layer 36, serving as a lower capacitor plate, overlies the via hole 32 and an adjacent portion of the frontside surface 24. The first conductive layer 36 is electrically coupled to the backside ground plane 28 by the metallized via hole 32. A dielectric layer 40, serving as a capacitor dielectric, overlies a portion of the first conductive layer 36. A second conductive layer 44, serving as a top capacitor plate, overlies a portion of the dielectric layer 40.

Thus, a parallel-plate capacitor structure is formed that comprises a first conductive layer 36, a dielectric 40, and a second conductive layer 44. The first conductive layer 36 is electrically common with the metallized via-hole 32, thereby providing a low-inductance ground connection to the backside ground plane.

As mentioned above, the volume overlying the via hole 32 and extending vertically defines a capacitor exclusion zone 34. It is preferred that no portion of either the dielectric layer 40 or of the second conductive layer 40 penetrates the capacitor exclusion zone 34.

Figure 4:
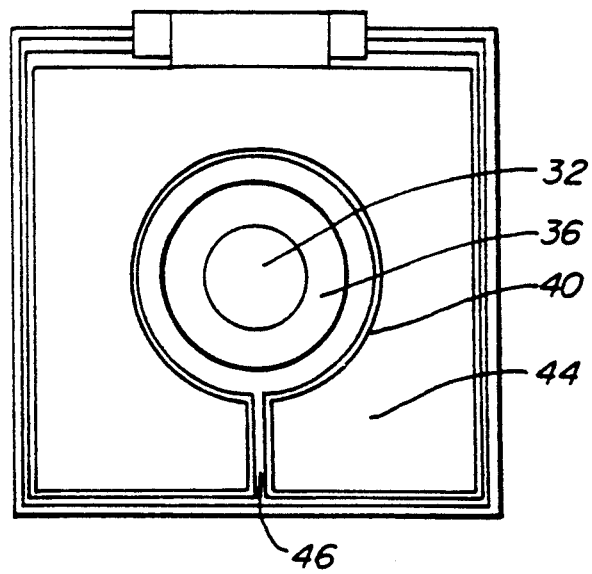
FIG. 4 is a diagram of a top view of an embodiment of a capacitor-around-via structure.

FIG. 4 illustrates the via hole 32; capacitor exclusion zone 34, extending vertically above the via hole; second conductive layer 44, including a portion defining a slot 46; a portion of the dielectric layer 40; and an air bridge 48. The dielectric layer 40 overlies a portion of the first conductive layer 36 and substantially surrounds, but lies outside, the capacitor exclusion zone 44. The second conductive layer 44 overlies a portion of the dielectric layer 40 and substantially surrounds, but lies outside, the capacitor exclusion zone 34. The patterns of the dielectric layer 40 and the second conductive layer 44 are, in a preferred embodiment, substantially similar.

The slot 46 in the pattern of the second conductive level 44, although not required for operation of the invention, facilitates easy removal of photoresist during processing. An air bridge 48 is used to make an electrical connection between the second conductive layer 44 and another component on the MMIC (not shown).

Figure 5:
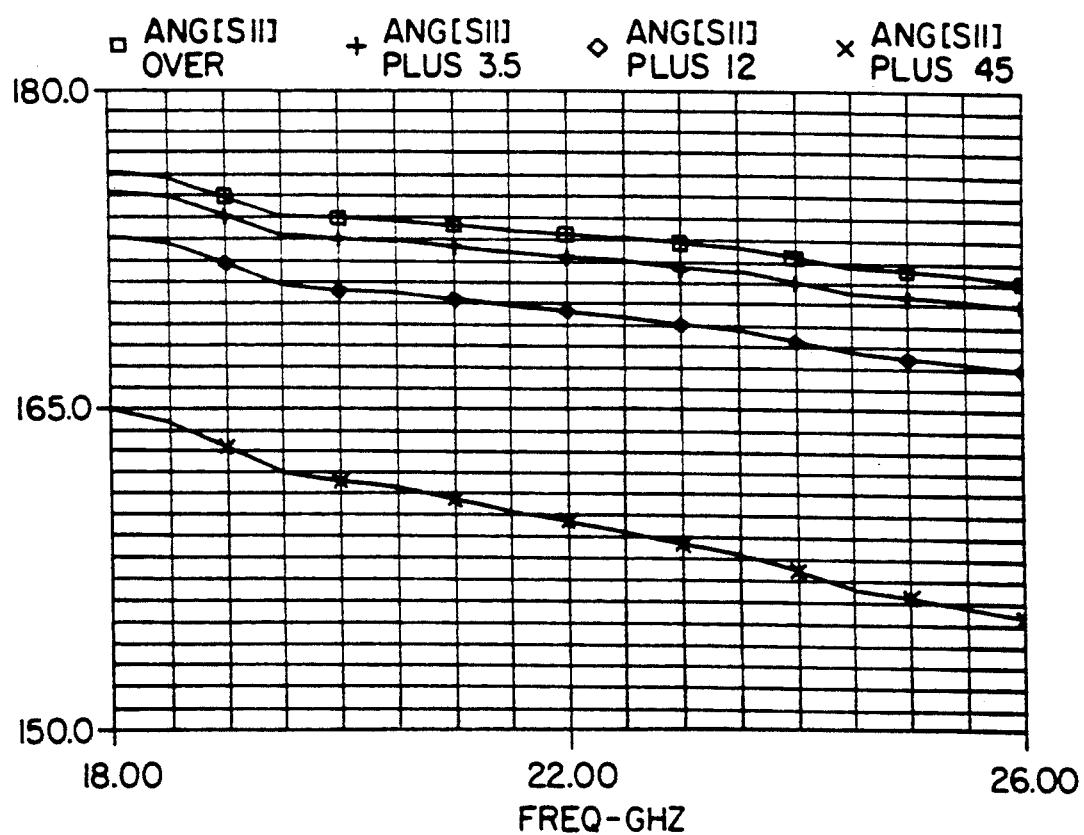
FIG. 5 is a graph that compares test results measuring phase of $S_{11}$ of a capacitor-near-via structure, a capacitor-over-via structure, and two embodiments of a capacitor-around-via structure.

FIG. 5 is a graph that compares the performance characteristics of two embodiments of the capacitor-around-via structure with those of the capacitor-near-via structure and with the capacitor-over-via structure. The capacitance of the four MIM structures tested are each 5.3 picofarads. The two capacitor-around-via structures differ by the via-to-MIM spacings, being 25 μm and 50 μm, respectively. [Tom Apel: add better and fuller description of test/results]

Significantly, the inductive component of the two capacitor-around-via structures are much more like the capacitor-over-via structures than like the capacitor-near-via structures. Thus, the capacitor-over-via structure can be replaced with an embodiment of the present invention without significant degradation of performance.

Figure 6:
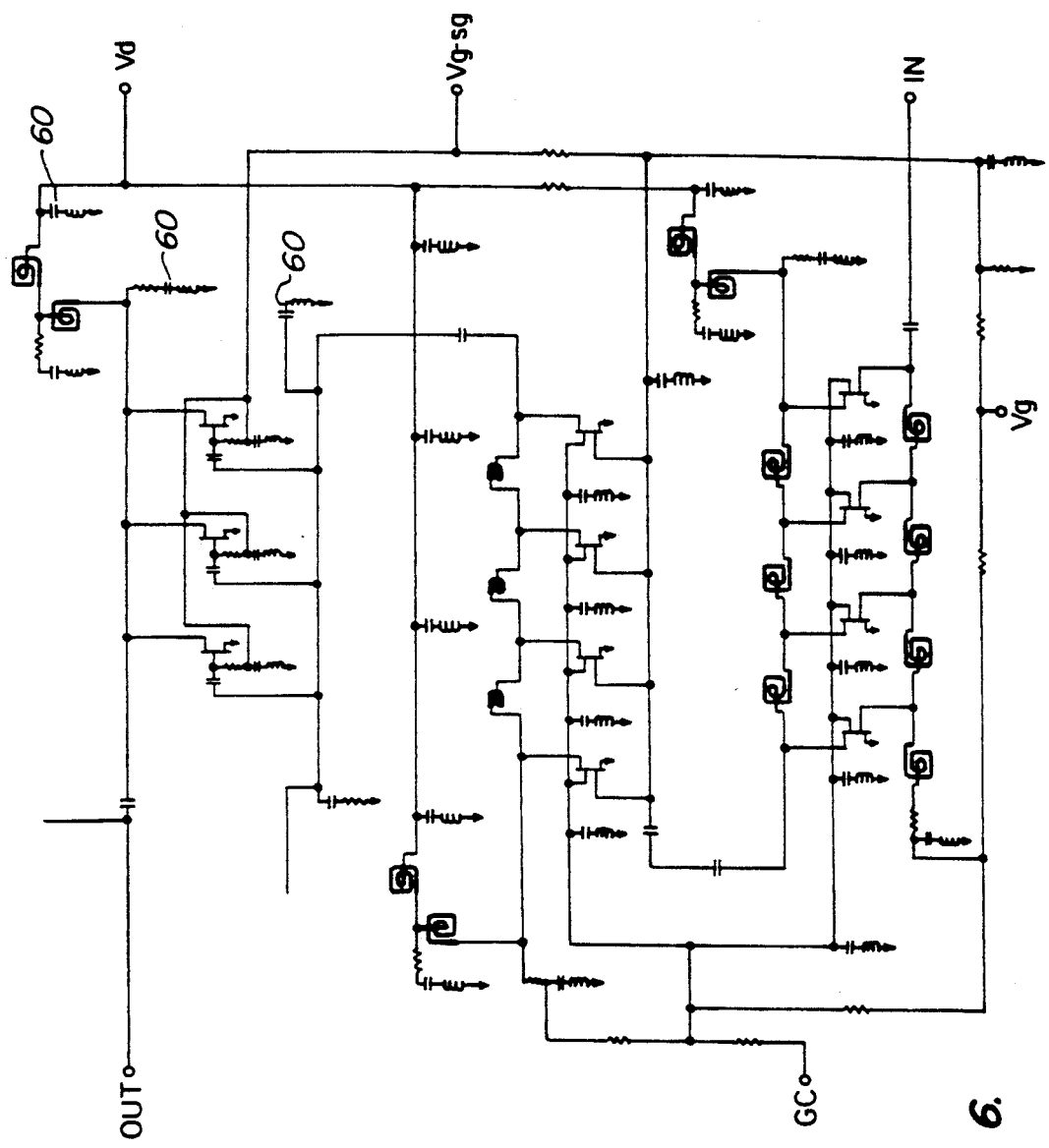
FIG. 6 is a schematic circuit of a compact, high-gain, 2-20 Ghz MMIC wide-band driver amplifier incorporating a plurality of LC networks connected to ground.
Figure 7:
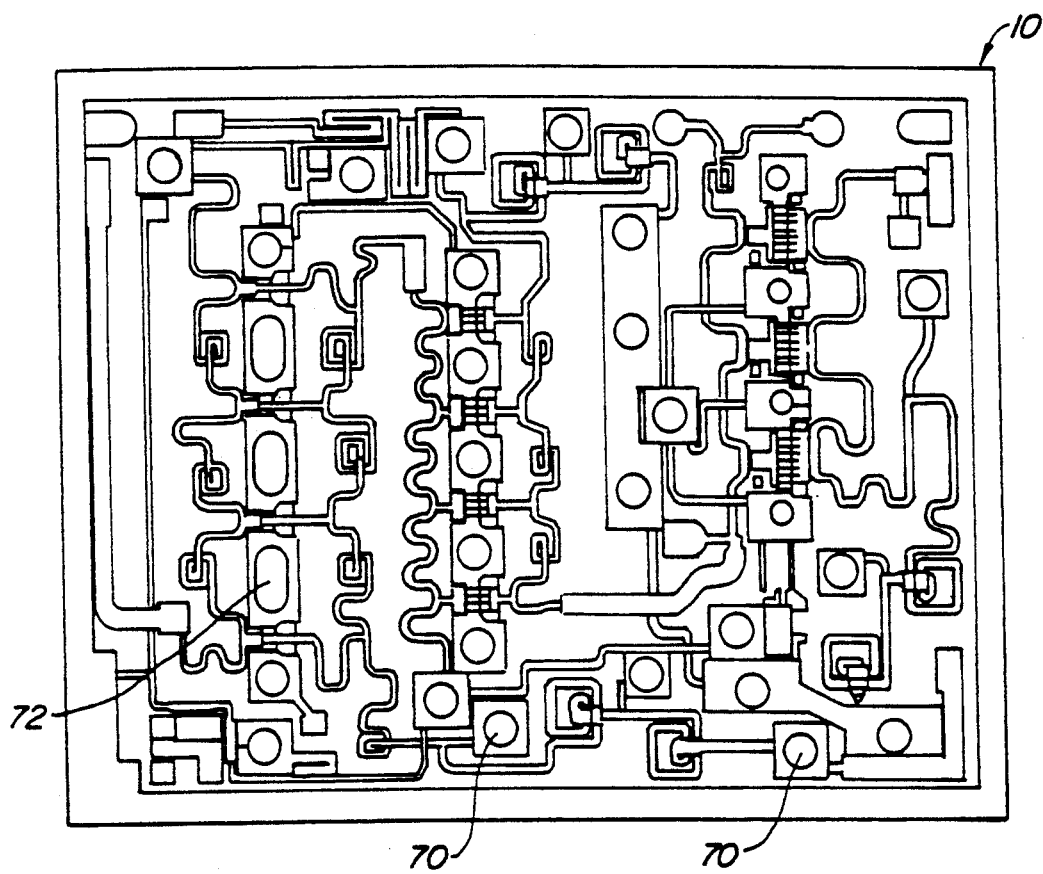
FIG. 7 is a diagram of the compact, high-gain, 2-20 Ghz MMIC wide-band driver amplifier of FIG. 6.

FIG. 6 is a schematic diagram of a wideband driver amplifier circuit suitable for implementation in MMIC form. The circuit employs numerous capacitors 60. FIG. 7 is a photomicrograph of a fabricated MMIC 10 incorporating the wideband driver amplifier circuit of FIG. 6. The MMIC 10 incorporates numerous capacitor-around-via structures, including substantially circular and substantially oval embodiments, 70 and 72 respectively.

There are many MMIC fabrication processes in use today. The processing technology required to manufacture MMICs employing via-hole technology involves both frontside and backside processing steps. These processing steps are well known in the art. A summary of MMIC fabrication techniques may be found in Chapter 4 of *GaAs Integrated Circuits* (1988), authored by the inventor of the present application, and *Microwave Solid State Circuit Design,* authored by I. Bahl and P. Bhartia, (1988). These references are incorporated herein by reference.

A short outline of steps involved in fabricating the capacitor-around-via structure will now be given; however, fabrication of a real-world MMIC will likely involve additional steps because active and other passive elements will be fabricated simultaneously. The frontside processing steps needed to fabricate a MIM include a first-level metallization, dielectric film deposition, and second-level metallization.

A first-level metal deposition (serving as lower capacitor plate) is typically selected from the following group of metal compositions: Cr/Pt/Au, Mo/Au, Al, and Ti/Pt/Au. Following the first-level metallization, a dielectric film is deposited.

The most common dielectric material in use for MIM structures is silicon nitride ($Si_3N_4$); however, silicon dioxide, polyimide, and others also provide satisfactory results. The thickness of the dielectric film determines the capacitance per unit area of the MIM capacitor.

The second-level metal (serving as top capacitor plate) is then deposited over the dielectric film, typically using Ti/Pt/Au. Gold plating is often used to realize low-resistance connections to other circuit elements.

The backside processing is considered even more important than frontside processing, because, in a production environment, a significant investment has been made in the wafer by the time that the frontside processing is completed. After the backside of the wafer is polished, photolithographic techniques are used to open holes at the desired ground connections. The exposed gallium arsenide is chemically etched away until a hole is etched completely through the substrate.

For fabrication of the capacitor-around-via structure, the etchant will open a hole directly under the first conductive layer. The backside of the wafer is then metallized to form the ground plane and to fill in the hole. The chosen metallization method (e.g., sputtering) must ensure that continuity exists between the ground plane and the metal which enters the hole and covers the interior slope of the hole.

In principle, the backside via-hole processing is straightforward, but, in practice, the etching of the via hole, particularly in a thick wafer, can be the source of many technological problems, including cracking, that threaten long-term reliability of the MMIC.

A reliable design for MIM capacitors is important because some MMIC circuits contain more capacitors than any other component. Thus, the capacitor yield could dominate the overall yield of the MMIC. Thus, to preserve their considerable investment in the already-completed frontside fabrication, most foundries take a conservative approach to implementing capacitor-via structures, particularly with respect to backside processing of via holes.

Accordingly, the prior art capacitor-over-via technology is considered by many foundries to be risky. The capacitor-around-via structure provides the ease of implementation attendant with the capacitor-near-via structure, while providing performance similar to the capacitor-over-via technology.

In general, to those of ordinary skill in the art to which this invention relates, many changes in fabrication and many widely differing embodiments and applications of the present invention will suggest themselves without departing from the spirit and scope of the invention. For example, although the illustrated embodiments depict a near-complete surrounding of the via hole, embodiments are possible that only partially surround the via hole.

Moreover, although the illustrated embodiments show only substantially circular or rectangular structures, the capacitor-around-via structure may be fabricated using virtually any other shape. Capacitor structures involving a plurality of via holes are also practicable. Thus, the disclosures and description herein are purely illustrative and are not intended to be in any sense limiting. The scope of the invention is set forth in the appended claims.

What is claimed is:

1. In a monolithic microwave integrated circuit (MMIC) employing a via hole to provide electrical continuity between a frontside conductive layer and a backside ground plane, a capacitor-around-via structure comprising:
   (a) a substrate, having a frontside surface, a backside ground plane, and a via hole extending through said substrate, a volume overlying the via-hole opening defining a capacitor exclusion zone;
   (b) a first conductive layer overlying the via hole and an adjacent portion of said frontside surface, said first conductive layer being electrically coupled to said backside ground plane by said via hole;
   (c) a dielectric layer, overlying a portion of said first conductive layer and substantially surrounding, but lying outside, said capacitor exclusion zone; and
   (d) a second conductive layer, overlying a portion of said dielectric layer and substantially surrounding, but lying outside, said capacitor exclusion zone.

2. The capacitor-around-via structure of claim 1 whereby said substrate comprises gallium arsenide (GaAs).

3. A monolithic microwave integrated circuit chip incorporating a plurality of components on a substrate, including at least one capacitor-around-via structure as part of the integrated circuitry, said chip comprising:
   (a) a substrate, having a frontside surface, a backside ground plane, and at least one via hole extending through said substrate, a volume overlying each via-hole opening defining a capacitor exclusion zone;
   (b) a pattern of first conductive pads, each of said first conductive pads overlying at least one via hole and an adjacent portion of said frontside surface, each of said first conductive pads being electrically coupled to said backside ground plane by at least one of said via holes;
   (c) a plurality of dielectric islands, each of said islands overlying a portion of one of said first conductive pads and substantially surrounding, but lying outside, one of said capacitor exclusion zones; and
   (d) a pattern of second conductive pads, each of said second conductive pads overlying a portion of one of said dielectric islands and substantially surrounding, but lying outside, one of said capacitor exclusion zones.

4. A method of forming a capacitor-around-via structure on the substrate of a monolithic microwave integrated circuit (MMIC), said method comprising the steps of:
   (a) forming a first conductive layer over a portion of the frontside surface of a substrate, a portion of said first conductive layer defining a capacitor exclusion zone;
   (b) forming a dielectric layer over a portion of said first conductive layer, said dielectric layer substantially surrounding, but lying outside, said capacitor exclusion zone;
   (c) forming a second conductive layer over a portion of said dielectric layer, said second conductive layer substantially surrounding, but lying outside, said capacitor exclusion zone;
   (d) creating a via hole through the substrate at points underlying the capacitor exclusion zone; and
   (e) forming a conductive ground plane over a portion of the backside surface of the substrate and into the interior of said via hole to provide electrical continuity between said first conductive layer and said conductive ground plane.

* * * * *